(12) United States Patent
McElvain

(10) Patent No.: US 8,724,665 B2
(45) Date of Patent: May 13, 2014

(54) PSEUDO-SYNCHRONOUS TIME DIVISION MULTIPLEXING

(75) Inventor: Kenneth S. McElvain, Menlo Park, CA (US)

(73) Assignee: Synopsys, Inc., Mountain View, CA (US)

( * ) Notice: Subject to any disclaimer, the term of this patent is extended or adjusted under 35 U.S.C. 154(b) by 1314 days.

(21) Appl. No.: 12/506,200

(22) Filed: Jul. 20, 2009

(65) Prior Publication Data

US 2011/0013650 A1 Jan. 20, 2011

(51) Int. Cl.
*H04J 3/02* (2006.01)
(52) U.S. Cl.
USPC .......................... 370/537; 370/442; 370/458
(58) Field of Classification Search
USPC ............... 370/231, 442, 458, 503, 532–545
See application file for complete search history.

(56) References Cited

U.S. PATENT DOCUMENTS

| | | | |
|---|---|---|---|
| 5,566,189 A * | 10/1996 | Laskowski | 714/746 |
| 6,359,946 B1 | 3/2002 | Ryan | |
| 6,788,109 B2 | 9/2004 | Kitagawa | |
| 7,007,254 B1 * | 2/2006 | Borkovic et al. | 716/122 |
| 7,739,097 B2 * | 6/2010 | Sample et al. | 703/19 |
| 2003/0147367 A1 * | 8/2003 | Pucheu et al. | 370/337 |
| 2008/0069151 A1 | 3/2008 | Satoh et al. | |
| 2008/0088492 A1 * | 4/2008 | Wiley et al. | 341/98 |

OTHER PUBLICATIONS

PCT/US2010/042012, International Preliminary Report on Patentability, Date of Mailing Feb. 2, 2012, 6 pages.
PCT/US2010/042012, International Search Report and Written Opinion, mailing date Jan. 25, 2011, 9 pages.

* cited by examiner

*Primary Examiner* — Ricky Ngo
*Assistant Examiner* — Wei-Po Kao
(74) *Attorney, Agent, or Firm* — Blakely, Sokoloff, Taylor & Zafman LLP; Judith A. Szepesi

(57) ABSTRACT

Methods and apparatuses to multiplex logic data pseudo synchronously are described. A representation of a multiplexer logic is generated to transmit data items asynchronously relative to a design clock. The data items may be transmitted under control of a transmission clock from a first integrated circuit to a second integrated circuit. A representation of a counter logic may be generated to couple with the multiplexer logic for transmitting the data asynchronously. Additionally, a representation of reset logic may be generated for a configuration to repeatedly reset the counter logic. Synchronization signals may be generated for a design clock cycle of a design clock driving the data items. The synchronization signals may be transmitted via the transmission clock asynchronous with the design clock. The data items may be transmitted via a number of transmission slots determined based on the clock cycles of the transmission clock and the design clock The total time for the transmission slots for transmitting the logic data may be less than the clock cycle of the design clock. One or more transmission slots within the clock cycle of the design clock may be used to transmit the synchronization data to indicate a new cycle to transmit the data items according to the design clock.

17 Claims, 9 Drawing Sheets

PSEUDO-SYNCHRONOUS TIME DIVISION MULTIPLEXING

FIELD OF THE INVENTION

The invention relates to digital circuits, and more particularly to the design of digital circuits with Time Division Multiplexing (TDM) of digital signals.

BACKGROUND OF THE INVENTION

One of the advantages of a time domain multiplexing scheme to transmit digital signals is that a plurality of digital signals or channel signals can be transmitted sharing a single transmission channel. For example, TDM is commonly applied in ASIC (application specific integrated circuit) and FPGA (field programmable gate array) designs to reduce pin counts used for communication to other chips. As chip densities have increased, pin counts have not kept pace making TDM based communication more attractive. In ASIC, prototypes may be built by mapping partitions of the ASIC design onto FPGAs. Because ASIC modules were designed to be connected on a single chip, they often have 5-10 times the connections between them as are available in IC packages. If a connection between chips is being shared many times per design clock cycle, then the performance of transmission will limit the speed of the system. Improvements in the TDM transmission rate are then highly valuable.

Typically, TDM is either synchronous or asynchronous. Synchronous TDM can be high performance because signals to be transmitted can be assigned a single time slot per clock cycle, allowing efficient use of the available time. However, maintaining accurate clock synchronization between multiple ICs can be both expensive and difficult, requiring the creation and distribution of high frequency clocks associated with each clock involved in chip interconnection. Failure to maintain accurate synchronization between chips limits the rate of transmission. The use of source synchronous transmission and buffering in a FIFO (First In First Out) can be used to overcome the synchronization issue where latency is not important. However, in many uses such as ASIC prototyping, latency has tight constraints and a FIFO can't be used.

Asynchronous TDM uses a high frequency transmission clock that is not synchronized to the user clock. Instead, the data is sampled and transmitted multiple times per design clock cycle, such as describe in, for example, U.S. Pat. No. 7,007,254 entitled "Methods and Apparatus for the Design and Analysis of Digital Circuits with Time Division Multiplexing" to Drazen Borkovic and Kenneth S. McElvain. The virtues of the asynchronous scheme are that a single TDM clock can be distributed with loose synchronization constraints and there is no complex slot assignment to determine as the transmission slots are not synchronized to the design clocks anyway. In such a scheme the time between successive samples of a given design signal becomes part of the chip-to-chip delay. For high TDM ratios where many distinct signals are sharing the same channel, this oversampling delay can become quite large and is the major deficiency of the scheme.

Therefore, traditional TDM schemes fail to meet the performance and resource requirements in heavily interconnected multi-device systems such as ASIC prototypes and there is a need for improvement.

SUMMARY OF THE DESCRIPTION

Methods and apparatuses for designing digital circuits with pseudo synchronous time division multiplexing are described here. Some embodiments of the present inventions are summarized in this section.

In at least one embodiment of the present invention, the number of data item transmission slots can be determined from the periods of the transmission clock and the design clock. A data item is a multi-valued symbol, a special case being a Boolean value. A number of transmission slots for data items can be determined as the number of slots such that the total time for the data item slots is less than the period of the design clock. Most of the slots may be used to transmit data item values with some slots used for synchronization information.

In one aspect of the invention, a representation of a slot counter with a range larger than the number of transmission slots can be generated. The counter can be reset by the edge of the design clock that generates the data to be transmitted. The counter value can be used to control input selection logic which selects and transmits the data item associated with each numbered slot.

In another aspect of the invention, in the receiving chip, a representation of a slot counter is generated. The values of the receiver counter can be used to distribute and/or de-multiplex the stream of data values In yet another aspect of the invention, after all the data items have been transmitted, which can be determined by the transmit counter counting past the number of transmission slots, the input selection logic can select and/or transmit '0' values. When the counter is reset to 0, the input selection logic can select a value of '1' and/or transmit it in a specific numbered slot, such as slot 0 or slot 1. In the receiving chip or circuit, a reset generation circuit can be generated for the receiver counter. After the receive counter has counted through all the determined slot numbers, the receive reset generation circuit can wait for a '0' to '1' transition in the input data stream, which identifies the transmit slot number of the '1' value and the counter can be reset to match the identified slot number. This mechanism can maintain agreement on the slot numbers between the transmit and receive circuits despite variation of the clock frequencies as long as the TDM clock is sufficiently faster than the design clock. The result of this mechanism is to roughly synchronize the positions of the numbered data item transmission slots with respect to the design clock edges without synchronizing the design clock and the transmission clock. This slot synchronization without clock synchronization is why we call the method pseudo-synchronous TDM.

In yet another aspect of this invention, multiple parallel TDM channels may share some or all of the synchronization elements including reset generation circuits and counters. Only a single member of the group of parallel channels would then need to send synchronization data, freeing a few more transmission slots for sending data items.

In yet another aspect of this invention, a representation of multiplexer logic may be generated to transmit data items asynchronously relative to a design clock. The data items may be transmitted under control of a transmission clock from a first integrated circuit to a second integrated circuit. A representation of a counter logic may be generated to couple with the selection logic for transmitting the data items in a sequence of time slots within a clock cycle of the design clock. Additionally, a representation of reset logic may be generated for a configuration to repeatedly reset the counter logic.

In yet another aspect of the invention, a representation of de-multiplexing logic may be generated to receive data asynchronously relative to a design clock. The data may be received under control of a transmission clock from a first integrated circuit to a second integrated circuit. A representation of a counter logic which is coupled to the representation of the extraction logic may be generated to receive the data asynchronously. Additionally, a representation of a reset logic may be generated with a configuration to repeatedly reset the counter logic In another aspect of the invention, synchronization signals may be generated for a design clock cycle of a design clock driving a logic device. The synchronization signals may be transmitted via a transmission clock asynchronous with the design clock. Subsequently, data items from the logic device may be transmitted within a clock cycle of the design clock via a multiplexing scheme clocked by the transmission clock.

In yet another aspect of the invention, synchronization signals may be detected as received from an input port of a logic device according to a transmission clock. One or more signals may be de-multiplexed from the input port clocked by the transmission clock subsequent to the detection of the synchronization signals. De-multiplexed signals may be buffered within a clock cycle of a design clock driving the logic device asynchronous to the transmission clock.

In yet another aspect of the invention, a digital circuit may include design logic, synchronization logic and a multiplexing logic for communicating multiple signals over a communication port of a chip. The design logic may generate the signals clocked by a design clock. The synchronization logic driven by the design clock and a transmission clock may generate synchronization signals to approximately align the transmission slots based on the asynchronous transmission clock with the design clock. The multiplexing logic coupled with the design logic and the synchronization logic may transmit the synchronization signals and the multiple signals over the communication port according to the transmission clock In yet another aspect of the invention, the earliest possible sampling time relative to the design clock edge of each transmission slot is computed. This computation may take into account the earliest possible reset of the transmission counter. The latest possible delivery time relative to the receiving design clock edge may also be computed. This computation may take into account the latest possible time of reset of the transmission counter. Then, design signals may be assigned to slots so that they meet the timing analysis requirements implied by the computed sampling and delivery times The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention.

Many of the methods of the present invention may be performed with a digital processing system, such as a conventional, general purpose computer system. Special purpose computers which are designed or programmed to perform only one function may also be used.

Reference in the specification to "one embodiment" or "an embodiment" means that a particular feature, structure, or characteristic described in connection with the embodiment can be included in at least one embodiment of the invention. The appearances of the phrase "in one embodiment" in various places in the specification do not necessarily all refer to the same embodiment.

The processes depicted in the figures that follow, are performed by processing logic that comprises hardware (e.g., circuitry, dedicated logic, etc.), software (such as is run on a general-purpose computer system or a dedicated machine), or a combination of both. Although the processes are described below in terms of some sequential operations, it should be appreciated that some of the operations described may be performed in different order. Moreover, some operations may be performed in parallel rather than sequentially At least one embodiment of the present invention seeks to transmit digital signals via a pseudo synchronous TDM system including positions of indexed time slots vary over the range of a clock cycle (or user clock cycle) of a source design clock. Using an edge of the source design clock, a counter or a state machine may be reset to position time slot 0 (first time slot within the clock cycle associated with the edge) periodically to be close to the clock edge. A source design clock may be identified by traversing from signals being transmitted back to flip-flops in a design. Positioning of time slot 0 or other time slots relative to the design clock edge may be based on timing analysis, such as in synchronous TDM based signal transmission. Each signal (or logic data) may be transmitted consuming only one time slot. As a result, bandwidth is increased and effective delay is dramatically decreased relative to asynchronous TDM implementations.

For example, at a 1 GHz transmission rate, a 64 to 1 multiplexing ratio, with 20 ns representing the delay of the multiplexer and demultiplexer plus the chip to chip interconnect delay, would result in an effective delay of 84 ns (or 64 ns+20 ns) for an asynchronous TDM scheme limiting the system frequency to about 10 MHz. In comparison, a corresponding pseudo synchronous TDM scheme would have an effective delay of about 28 ns (or 8 ns+20 ns) yielding a system speed over 25 MHz.

Figure 1:
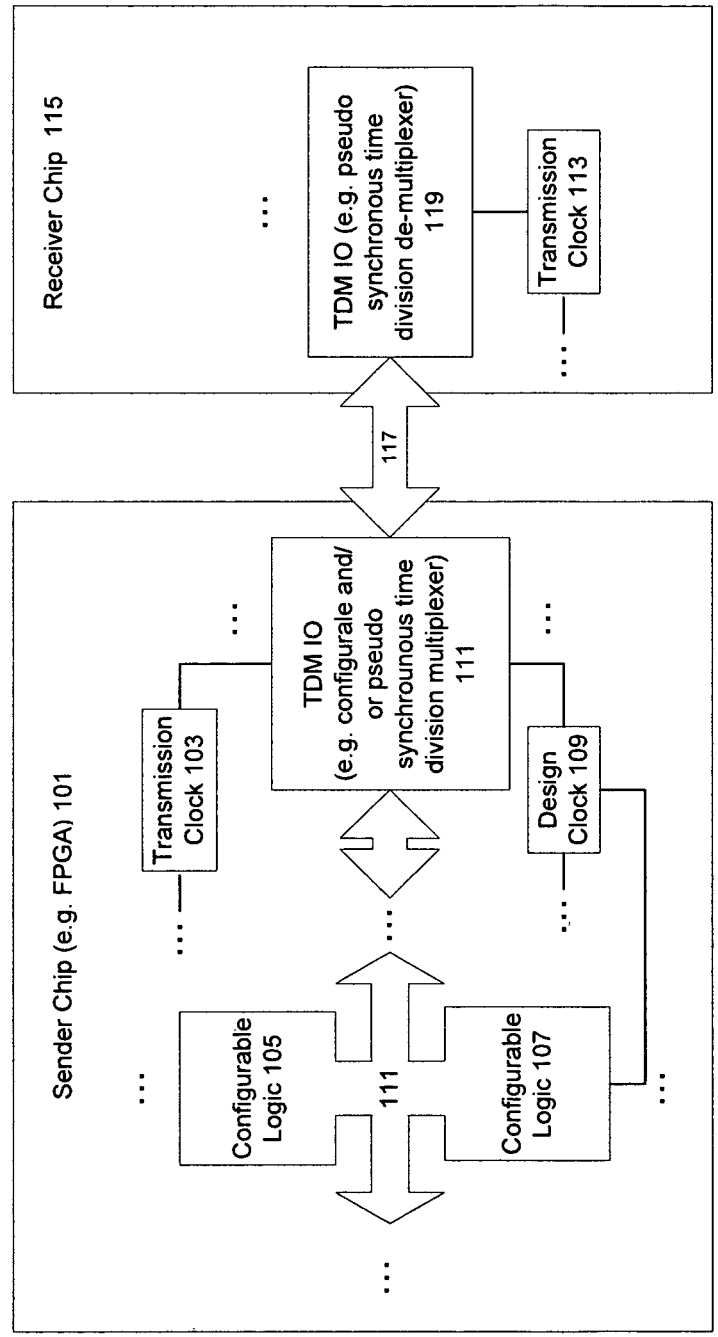
FIG. 1 illustrates a multi chip digital design including a pseudo synchronous TDM according to one embodiment of the present invention.

FIG. 1 illustrates a multi chip digital design including a pseudo synchronous TDM according to one embodiment of the present invention. A multiplexer may combine multiple signals into a single signal stream to share one transmission resource. Typically, a digital design may include design modules spread across multiple chips such as a sender chip 101 and a receiver chip 115. In one embodiment, chips 101 and/or 115 may be programmable logic devices, such as FPGA devices to enable emulation of the digital design. Chip interconnects 117 may be physical wires between chips. In some embodiments, chip interconnects 117 may be based on optical or wireless connections. Usually, data signals passing among design modules across chips, e.g. chips 101 and 115, may share the same physical connections 117 via different time slots.

Inside the sender chip 101, design modules may be configured into one or more blocks 105, 107 coupled by interconnects, such as interconnect 111. In one embodiment, a design clock 109 drives multiple logic blocks 105, 107 within the sender chip 101. The design clock 109 may be based on a clock source driving multiple chips including the receiver chip 115 to perform computations.

In one embodiment, the sender chip 101 transmits logic data from design blocks within the chip, such as 105 and 107, to an outside chip, such as receiver chip 115 according to a transmission clock driving an IO logic, such as TDM IO 111. A transmission clock 113 may drive a corresponding IO port of the receiver chip 115 to receive logic data from the sender chip 101 via chip interconnects 117. In one embodiment, transmission clocks for logic data between a source chip, e.g. the sender chip 101, and a target chip, e.g. the receiver chip 115, are synchronous or based on a single clock source. In another embodiment, the transmission clock on each chip is not controlled with respect to the transmission clocks on other chips and receive logic in a receiver chip is clocked by a source synchronous clock sent alongside the data.

TDM IO 111 may transmit logic data from the sender chip 101 to a corresponding TDM IO 119 of the receiver chip 115 in a pseudo synchronous TDM manner. TDM IO 119 may include a pseudo synchronous TDM de-multiplexer which extracts multiple signals from a single signal stream received. In one embodiment, TDM IO 111 are coupled with both the transmission clock 103 and the design clocked 109 to transmit logic data based on a TDM scheme which separately synchronizes each clock cycle of the design clock 109 with multiple clock cycles or time slots of the transmission clock 103. In one embodiment, the design clock 109 driving logic operations and the transmission clock 103 driving data transmission across chips are asynchronous (e.g. without known phase or specific frequency relationships between each other).

Figure 2:
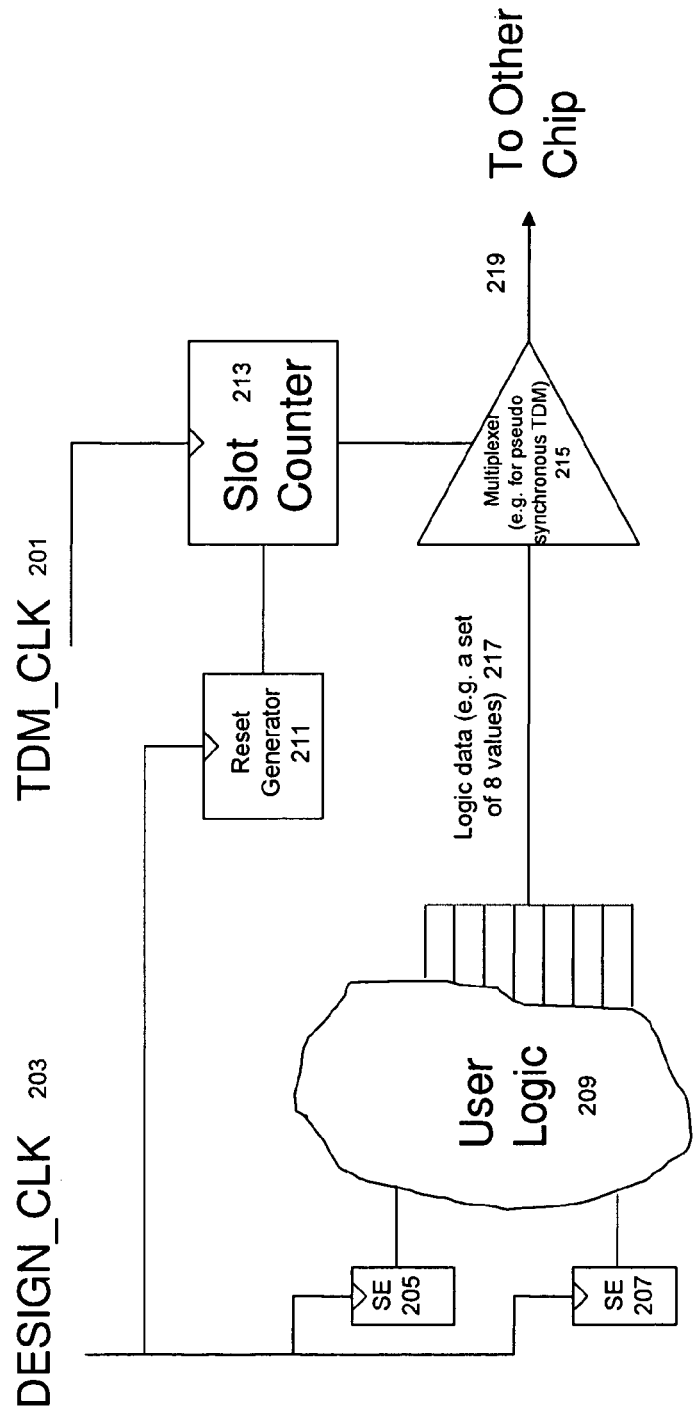
FIG. 2 illustrates an exemplary digital circuit including pseudo synchronous time division multiplexer according to one embodiment of the present invention.

FIG. 2 illustrates an exemplary digital circuit including pseudo synchronous time division multiplexer according to one embodiment of the present invention. Exemplary circuit 200 may be implemented in a chip such as sender chip 101 of FIG. 1. IO logic, such as TDM IO 111 of FIG. 1 may include reset generator logic 211, a slot counter logic 213 and/or a multiplexer 215. Logic data 217 may be output data from user logic 209, such as logic 105 and/or logic 107 of FIG. 1. In one embodiment, multiple logic data items 217 are transmitted to another chip via the multiplexer 215 in a pseudo synchronous TDM manner sharing interconnect wires 219, such as interconnects 117 of FIG. 1, across separate chips.

Exemplary circuit 200 may be driven by multiple asynchronous clocks, such as clock design_clk 203 and clock tdm_clk 201. User logic 209 may perform logic operations or computations to generate logic data 217, e.g. including multiple binary values, clocked by clock design_clk 203. Clock design_clk 203 may be generated according to, for example, the design clock 109 of FIG. 1. Sequence elements 205, 207 may be registers, flip-flops, or memory elements to pipeline clock signals to drive user logic 209. In one embodiment, clock tdm_clk 201 may be generated according to, for example, the transmission clock 103 of FIG. 1, to drive transmission of digital data across chips. Typically, clock tdm_clock 201 will be of higher frequency than clock design_clk 203.

In one embodiment, slot counter 213 generates a count for the multiplexer 215 to select logic data 217 to transmit over a time slot according to a transmission clock such as clock tdm_clk 201. Slot counter 213 may control the selection order of logic data 217 for transmission. Typically, a time slot for the multiplexer 215 corresponds to a clock cycle of clock tdm_clk 201. In one embodiment, the multiplexer 215 provides a separate time slot for each logic data 217 within a clock cycle of clock design_clk 203. As a result, all values of logic data 217 generated from the user logic 209 for each clock of clock design_clk 203 are transmitted across interconnects 219 during the corresponding clock cycle of clock design_clk 203.

Synchronization signals (or synchronization data) to align asynchronous clock design_clk 203 and clock tdm_clk 201 may be generated for each clock cycle of clock design_clk 203. In one embodiment, a multiplexer 215 is configured to generate the synchronization signals according to certain counts from the slot counter 213. For example, the slot counter 213 may include a saturation count and an initial count for the multiplexer 215 to select signal values to generate the synchronization signals.

A saturation count may be the largest count configured for a counter. A counter is saturated when the counter counts to its saturation count (or counter range) from an associated driving clock. A saturated counter may not perform additional counting in response to a driving clock. Typically, when a counter is reset, it is set to an initial count, e.g. 0, on the next clock cycle of its driving clock. A counter may be reset when receiving a reset signal.

In one embodiment, synchronization signals are based on signal values selected by the multiplexer 215 according to the initial and reset counts of the slot counter 213. A reset generator 211 may generate a reset signal for the slot counter 213. When the slot counter 213 counts between the initial and saturation counts, the multiplexer 215 may select logic data 217 for transmission. In one embodiment, once the slot counter 213 saturates, the multiplexer 215 may output a configured initial synchronization signal value, e.g. logic low or 0.

On receipt of a reset signal from the reset generator 211, the slot counter counts to its initial count (reset) on the next clock cycle of clock tdm_clk 201. In one embodiment, the multiplexer 215 outputs subsequent synchronization signal values configured based on the slot counter 213 counting from the initial count according to clock tdm_clk 201. For example, the synchronization signal transmitted via clock tdm_clk 201 may include a single logic high and/or a transition from a logic low to a logic high which can be unambiguously recognized.

According to one embodiment, the reset generator 211 derives reset signals from edges of design_clk 203. For example, the reset generator 211 can generate a reset signal to reset the slot counter 213 on the edge of each clock cycle of clock design_clk 203. The edge used may depend on the clock edge that generates the data to be transmitted. Typically, the number of time slots according to clock tdm_clk 201 within a clock cycle of clock design_clk 203 is more than the required number of time slots to transmit the logic data 217 via the multiplexer 215. Extra time slots may be allocated for digital circuit 200 to accommodate the synchronization signals.

In certain embodiments, multiple interconnects may transmit data in parallel sharing the same logic blocks for synchronizing data transmissions, such as reset generator 211 and/or slot counter 213 of FIG. 2. Each interconnect may be associated with a channel for transmitting data. For example, multiple channels, including the channel for interconnect 219, may share synchronization logic blocks such as slot counter 213 and reset generator 211 to transmit data in parallel for design clock 203. Consequently, additional data slots can be provided via parallel channels without the cost of extra synchronization logic blocks. In some embodiments, parallel channels share synchronization signals transmitted via a particular one of the parallel channels. A channel which does not need to transmit synchronization signals may transmit data concurrently while the particular channel transmits shared synchronization signals, e.g. during the same transmission slots.

Figure 3:
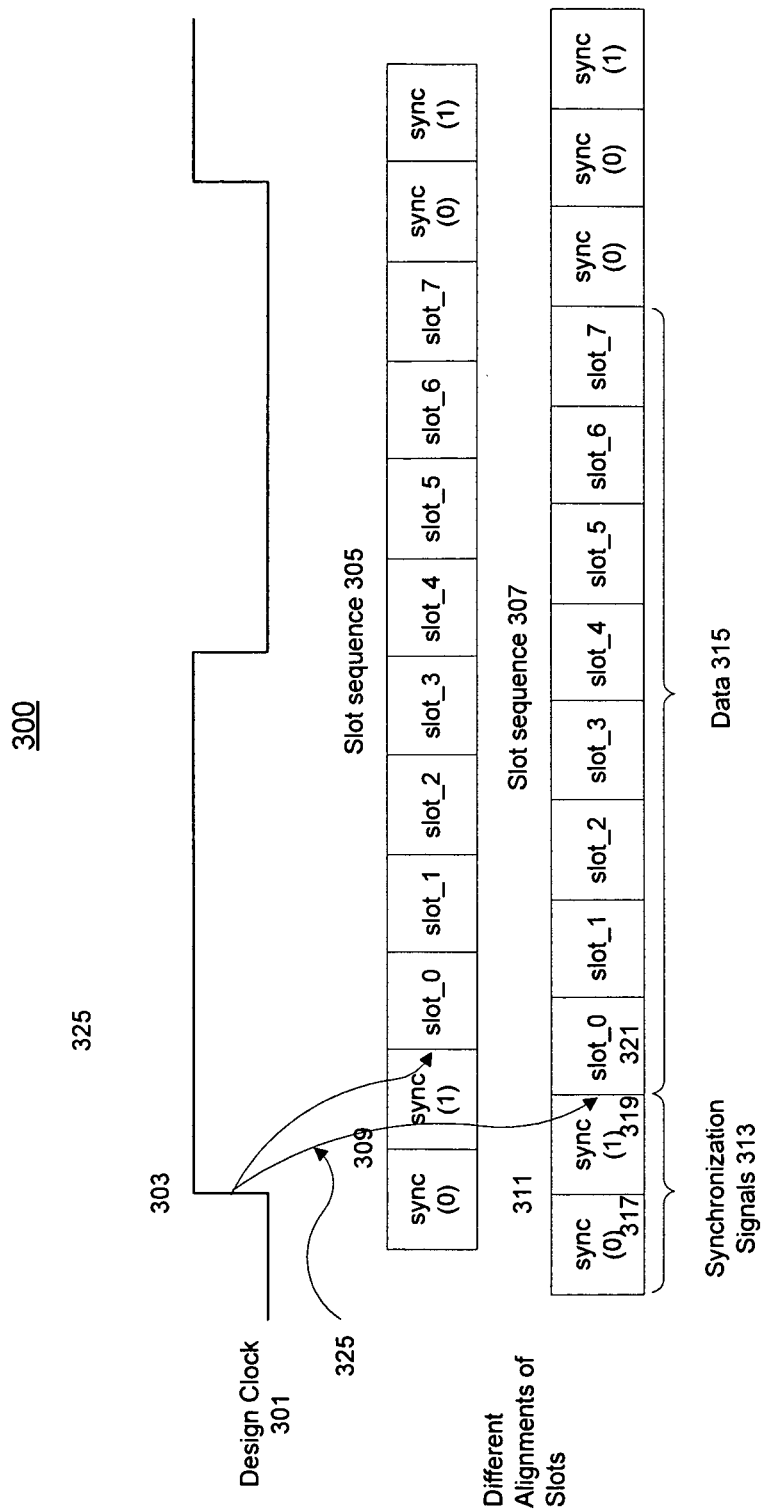
FIG. 3 is a timing diagram illustrating one example of pseudo synchronization between asynchronous clocks for time division multiplexing according to one embodiment of the present invention.

FIG. 3 is a timing diagram illustrating one example of pseudo synchronization between asynchronous clocks for time division multiplexing according to one embodiment of the present invention. For example, design clock 301 may include a clock cycle of a design clock driving user logics in a chip, such as design_clk 203 of FIG. 2. Slot sequences 305, 307 may illustrate two exemplary assignments of time slots by a pseudo synchronous TDM multiplexer, such as multiplexer 215 of FIG. 2, driven by a transmission clock, such as tdm_clk 201 of FIG. 2, aligned differently with the deign clock 301. A time slot or transmission slot may correspond to an edge (e.g. rising edge and/or falling edge) of a clock cycle of the transmission clock. A time slot may not include a complete clock cycle of the transmission clock.

In one embodiment, slot sequence 307 includes eight time slots slot_0 ... slot_7, for transmitting logic data 315 and two slots, sync slots 317, 319, for synchronization signals 313. Time slot slot_0 may be designated with label "0", time slot slot_1 may be designated with label "1", ... etc. Two design clock cycles (or periods) may include commonly labeled time slots, e.g. time slots labeled as "0", time slots labeled as "1", ... etc. Slot sequence 307 may correspond to an 8 by 1 multiplexer. Synchronization signals may include a pattern of transition from logic low, e.g. sync slot 317, to logic 1, e.g. sync slot 319. In one embodiment, a receiving port of the synchronization signals identifies the next time slot, slot 321, subsequent to receiving the synchronization signals (e.g. based on recognition of the unique signal pattern), as the first slot assigned to transmit logic data. Synchronization signals (or data) may indicate positions of time slots (or transmission slots) positioned within a clock cycle of a design clock. Thus synchronization logic generating the synchronization signals may select or determine which label to assign to each time slot. The timing of a time slot may be determined relative to a clock edge of a clock cycle (or period) of the transmission clock. In certain embodiments, multiple time slots may be positioned overlapping in time to transmit multiple data concurrently, e.g. using multiple voltage levels and/or different frequency light.

In certain embodiments, each labeled time slot is positioned with an offset (or time difference) from an edge of a clock cycle of a design clock associated with the labeled time slot. For example, slot_0 312 may be associated with an offset 325 relative to an edge 303 of design clock 301. Offsets associated with commonly labeled time slots may vary from one design clock cycle to another design clock cycle. Variations of offsets for commonly labeled time slots among different design clock cycles may be maintained within a predetermined bound, e.g. one or two transmission clock cycles of a transmission clock corresponding to the time slots.

In one embodiment, a counter corresponding to slot sequence 307, e.g. slot counter 213 of FIG. 2, saturates at value 9. As a result, a synchronization signal value of 0 (logic low) corresponding to the saturation count of the counter is forced at the next time slot, e.g. sync slot 317, from an associated pseudo synchronous TDM multiplexer, e.g. multiplexer 215 of FIG. 2. At time instance 303, in one embodiment, a rising edge of design clock 301 triggers a reset signal, e.g. via a reset generator 211 of FIG. 2, to reset the counter. Subsequently, at time instance 311 according to a transmission clock driving the counter, e.g. tdm_clk 201 of FIG. 2, the multiplexer generates a synchronization value of 1 (logic high) corresponding to the initial count of the counter for sync slot 319. Thus, the clock cycle of the design clock 301 is calibrated with a transmission clock corresponding to slot sequence 307 via synchronization signals 313. Logic data 315 is multiplexed in the following time slots as indexed from 0 to 7 starting at time slot 321. The number of sync slots with value 0 may differ from one design clock cycle to another design clock cycle.

Figure 4:
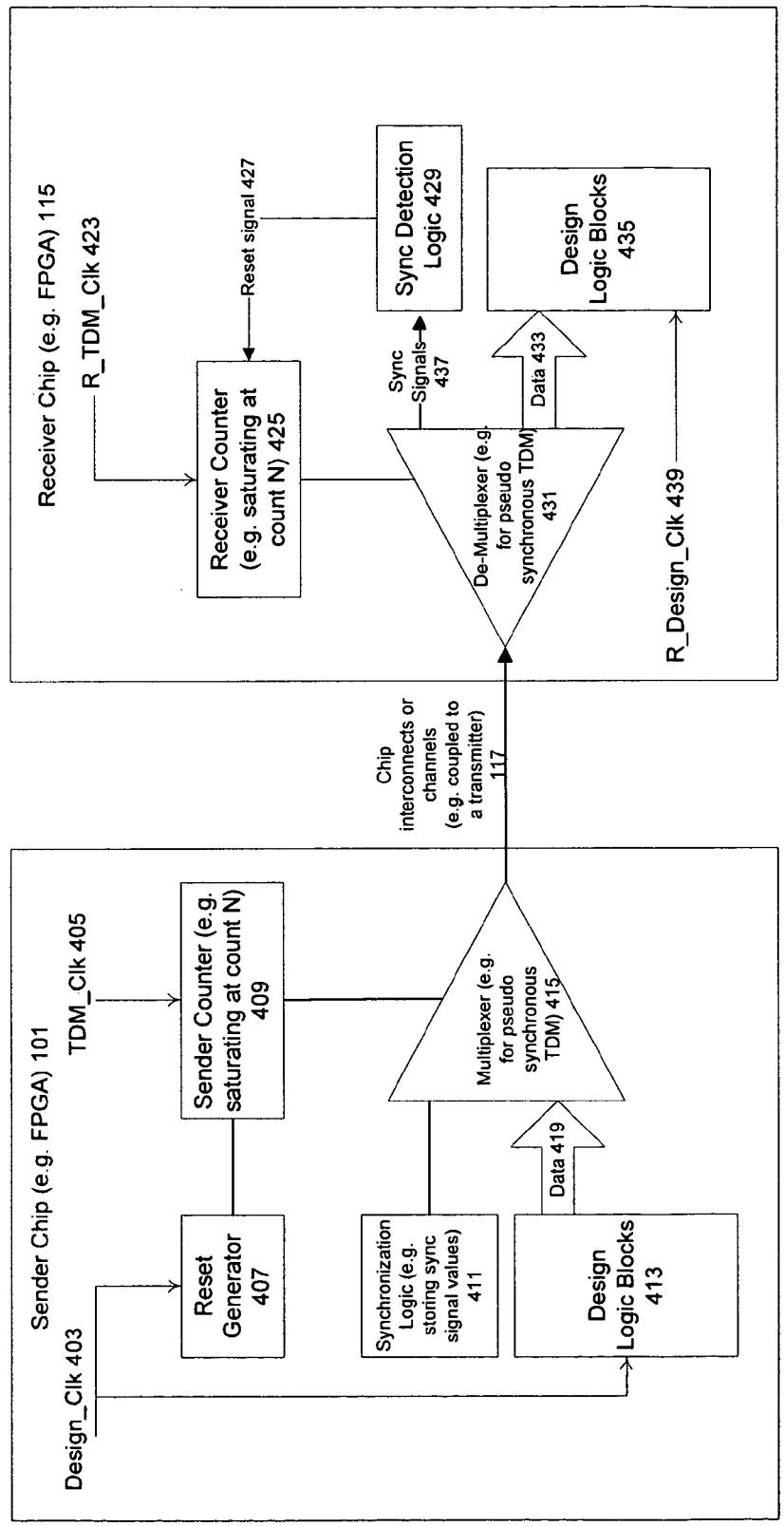
FIG. 4 illustrates a multi chip digital design including a pseudo synchronous TDM multiplexer transmitting synchronization signals according to one embodiment of the present invention.

FIG. 4 illustrates a multi chip digital design including a pseudo synchronous TDM multiplexer transmitting synchronization signals according to one embodiment of the present invention. For example, exemplary digital design 400 may be included in the sender chip 101 and/or receiver chip 115 of FIG. 1. In one embodiment, logic data 419 from source logic block 413 driven by clock design_clk 403 are transmitted across chip interconnects 117 by a transmission clock tdm_clk 405 asynchronous to clock design_clk 403. Interconnects 117 may be coupled to a transmitter logic driven by the transmission clock tdm_clk 405. Logic data 419 may be transmitted within one clock cycle of clock design_clk 403 aligned (e.g. pseudo synchronously) with clock tdm_clk 405, e.g. as illustrated in timing diagram 300 of FIG. 3. Clocks design_clk 403 and tdm_clk 405 may respectively correspond to design clock 109 and transmission clock 103 of FIG. 1.

In one embodiment, synchronization logic 411 is coupled with a multiplexer 415 to provide synchronization signal values for generating synchronization signals for the receiver chip 115. The synchronization logic 411 may include storage elements configured with synchronization signal values selectable via the multiplexer, e.g. according to a count from a sender counter 409. In one embodiment, the sender counter 409 clocked by clock tdm_clk 405 saturates at value N for the multiplexer 415 to select a first synchronization value from the sync logic 411 at the next time slot assigned according to clock tdm_clk 405. A clock cycle of clock design_clk 403 may trigger a reset generator 407 to set the sender counter 409 at a reset state. In one embodiment, a rising edge of a clock cycle triggers the reset generator 407 to generate a reset signal to reset the sender counter 409. Subsequently, at the next clock cycle of clock tdm_clk 405, the sender counter resets to an initial count for the multiplexer 415 to select a second synchronization value from the sync logic 411 at the corresponding time slot. Synchronization signals including the first and second synchronization values may be transmitted to the receiver chip 115 to align the time slots for transmitting logic data 419 for the receiver chip 115.

In one embodiment, the receiver chip 115 includes a de-multiplexer 431 to receive logic data and synchronization signals transmitted from the sender chip 101 in a pseudo synchronous manner. The receiver chip 115 may be a static or programmable logic device, such as an FPGA device. Logic data 419 collected over a series of time slots according to a transmission clock, such as clock r_tdm_clk 423, may be de-multiplexed into logic data 433 and latched (or buffered) in order for target logic block 435. In one embodiment, clock r_design_clk 439 drives target logic block 435 to perform computations. Clocks r_design_clk 439 of the receiver chip 115 and design_clk 403 of the sender chip may be asynchronous. In some embodiments, clocks r_design clk 439 and design_clk 403 are of a common frequency.

The receiver chip 115 includes a receiver counter 425 and a sync detection (or synchronization) logic 429 coupled with the de-multiplexer 431 to align counter values of receiver counter 425 with time slots (or transmission slots), such as assigning time slots for received logic data to the target logic block 435. For example, the sync detection logic 429 may recognize synchronization signals sent from the sender chip 101 to indicate a start of a sequence of time slots assigned for logic data 433. Multiplexed logic data received via interconnects 117 may be de-multiplexed according to a count counted by receiver counter 425 via the de-multiplexer 431. In one embodiment, the receiver counter is configured to share a common saturation count with the sender counter 409. Synchronization signals transmitted from the sender chip 101 may be forwarded to the sync detection logic 429 as sync signals 437 via the de-multiplexer 431 when the receiver counter 425 is saturated.

The sync detection logic 429 may send a reset signal 427 to reset the receiver counter on detection of synchronization signals received via the de-multiplexer 431. In one embodiment, the next time slot immediately following when the receiver counter 425 is reset starts the sequence of time slots for the de-multiplexed logic data. The receiver counter may be counted by clock r_tdm_clk 423 for the de-multiplexer 431. In one embodiment, clocks r_tdm_clk 423 and tdm_clk 405 share the same clock source as the transmission clock driving the chip interconnects 117. The sync detection logic 429 may recognize a synchronization pattern, such as a signal level change from logic low to logic high from synchronization signals received. The sync detection logic 429 and the corresponding sync logic 411 may be configured with a common synchronization pattern. In some embodiments, the receiver counter 425 and the sender counter 409 are aligned during a training period, during which logic data sent from the sender chip 101 are of a constant know value, such as logic low (0).

Figure 5:
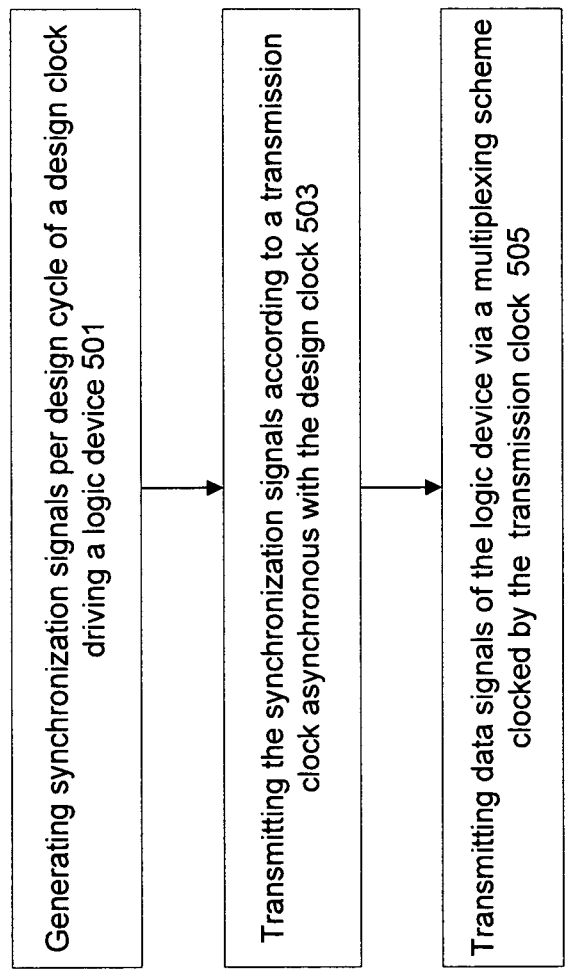
FIG. 5 is a flow diagram illustrating an embodiment of a control technique to multiplex data pseudo synchronously based on asynchronous clocks according to one embodiment of the present invention.

FIG. 5 is a flow diagram illustrating an embodiment of a control technique to multiplex data pseudo synchronously based on asynchronous clocks according to one embodiment of the present invention. For example, control flow 500 may be performed by a digital design 100 as shown in FIG. 1. In one embodiment, at block 501, the logic of control flow 500 generates synchronization signals per clock cycle of a design clock, such as design clock 109 of FIG. 1, driving a logic device. Multiple logic data from the logic device may share a single physical connection, such as interconnect 117 of FIG. 1, for coupling with another logic device, such as chip 115 of FIG. 1. Each logic data may pass through the physical connection per clock cycle of the associated design clock.

In one embodiment, the logic of control flow 500 may generates synchronization signals based on a state of a state machine, such as according to a counter counted by a counter logic. The logic of control flow 500 may determine a state for generating the synchronization signals according to an edge of the design clock (such as a rising edge). Thus, the synchronization signals are generated to align with each clock of the design clock. Synchronization signals may include predetermined patterns which can by unambiguously identified, for example, within a period corresponding to a clock period (or cycle) of the design clock.

At block 503, according to one embodiment, the logic of control flow 500 transmits the synchronization signals over a physical interconnect according to a transmission clock. The transmission clock and the design clock may be asynchronous (e.g. without a known phase or frequency relationship), such as clocks 309 and 303 of FIG. 3. Each clock cycle of the design clock may be long enough to include a predetermined number of clock cycles of the transmission clock (e.g. based on the length of the synchronization signals and the number of logic data to be transmitted for each clock cycle of the design clock). In one embodiment, the logic of control flow 500 counts a counter according to each clock of the transmission clock to determine a state of a state machine to generate the synchronized signals.

At block 505, the logic of control flow 500 may transmit data signals to multiplex logic data from a logic device to a target device according to a transmission clock. The logic of control flow 500 may perform data signal transmission subsequent to transmitting the synchronization signals, for example, starting in the next clock of the transmission clock transmitting the synchronization signals or based on other timing relationships. In one embodiment, the logic of control flow 500 updates a state machine to determine when all data values have been transmitted during a clock cycle of a design clock. The logic of control flow 500 may start synchronization signals subsequent to when the transmission of logic data is complete during a clock cycle of the design clock.

Figure 6:
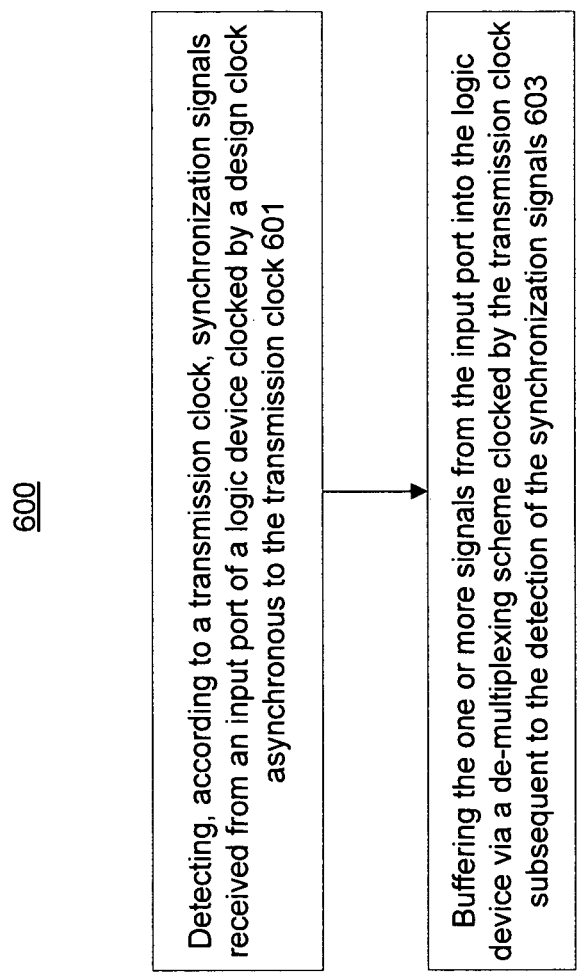
FIG. 6 is a flow diagram illustrating an embodiment of a control technique to de-multiplex data pseudo synchronously based on asynchronous clocks according to one embodiment of the present invention.

FIG. 6 is a flow diagram illustrating an embodiment of a control technique to de-multiplex data pseudo synchronously based on asynchronous clocks according to one embodiment of the present invention. For example, control flow 600 may be performed by a digital design 100 as shown in FIG. 1. In one embodiment, at block 601, the logic of control flow 600 detects synchronization signals clocked by a transmission clock to an input port of a logic device, such as receiver chip 115 of FIG. 1. The logic device receiving the synchronization logic may be clocked by a design clock asynchronous to the transmission clock. Each logic data may pass through the physical connection per clock cycle of the associated design clock.

The logic of control flow 600 may determine when to start detecting the synchronization signals during each clock cycle of a design clock based on a state of a state machine, such as according to a counter counted by a counter logic 425 of FIG. 4. The state machine may be driven by the transmission clock clocking the synchronization signals. In one embodiment, detection of synchronization signals may start when the counter indicates a predetermined number of logic data has been received during a clock cycle of the design clock. In one embodiment, the logic of control flow 600 identifies synchronization signals according to patterns of transitions of signals received. A particular transition, such as from logic 1 to logic 0, may indicate the end of synchronization signals during a clock cycle of the design clock.

In one embodiment, subsequent to the detection of the synchronization signals, at block 603, the logic of control flow 600 stores data signals received into separate buffers to de-multiplex logic data transmitted via an input port of a logic device clocked by a design clock. The logic of control flow 600 may count the number of logic data values received according to the transmission clock driving the transmission of the logic data values through to the input port. In one embodiment, the logic of control flow 600 starts counting the number of logic data values received according to the transmission clock (e.g. counting the number of clock cycles of the transmission clock). The logic of control flow 600 may wait for synchronization signals after a predetermined number of logic data values have been received. In one embodiment, the logic of control flow 600 repeats detecting the synchronization signals and de-multiplexing the predetermined number of logic data for each clock of a design clock asynchronous to the transmission clock.

Figure 7:
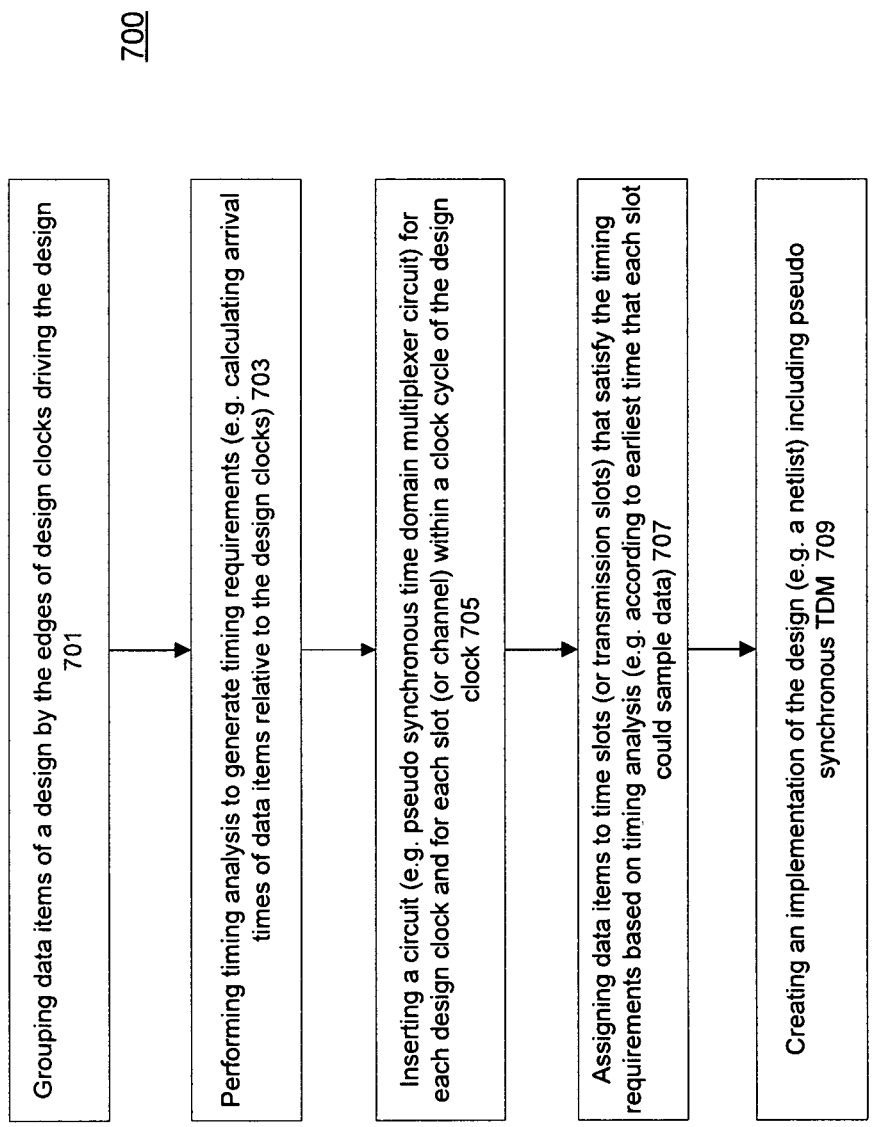
FIG. 7 is a flow diagram illustrating a process to create a design across multiple chips communicated pseudo synchronously according to one embodiment of he present invention.

FIG. 7 is a flow diagram illustrating a process to create a design across multiple chips communicated pseudo synchronously according to one embodiment of the present invention. Exemplary process 700 may be performed by a processing logic that may comprise hardware (circuitry, dedicated logic, etc.), software (such as is run on a dedicated machine), or a combination of both. For example, a software tool may be configured to automatically implement a design across multiple chips communicated pseudo synchronously according to process 700. In one embodiment, at block 701, the processing logic of process 700 groups data items (or signals) of a design by edges of design clocks driving the design. The processing logic of process 700 may identify an edge of a design clock by traversing the design from data items being transmitted back to a flip-flop of the design. Each edge or clock edge of a design clock may correspond to a clock cycle of the design clock. In one embodiment, a design may be based on an HDL (Hardware Description Language) description. All data items of the same group corresponding to a clock edge may arrive within a clock cycle of the clock edge. In one embodiment, at block 703, the processing logic of process 700 may perform timing analysis to generate timing requirements for assigning a data signal/value to a channel/slot. The processing logic of process 700 may calculate arrival time for transmitting each signal of the same group relative to the clock edge for a clock cycle corresponding to the group.

In one embodiment, at block 705, the processing logic of process 700 inserts a circuit for each design clock to multiplex signals (or logic data) driven by the clock in a pseudo synchronous manner. The time period for a clock cycle of the design clock may include one or more time slots (or channels), such as in slot sequence 305 for a design clock 301 of FIG. 3. A transmission clock which is asynchronous to the design clock may allocate the time slots based on clock cycles of the transmission clock. The circuit may multiplex logic data corresponding to a group of data items according to the number of slots within each clock cycle of the design clock. For each data item of the same group, at block 707, the processing logic of process 700 may assign a separate time slot within a clock cycle according to satisfy the timing constraints generated from a timing analysis. For example, a time slot (or transmission slot) for a data item or signal value may be assigned based on the arrival time of the data value calculated. In one embodiment, the assignment of time slots is based on the earliest time logic data could be sampled for the corresponding data item.

At block 709, the processing logic of process 700 may create an implementation of the design, such as generating a netlist including pseudo synchronous time domain multiplexer circuits. In one embodiment, the processing logic of process 700 loads (or installs) the design implementation (e.g. netlists stored in a memory) into one or more hardware devices, such as PLDs (programmable logic device) or FPGAs, to configure the design. The processing logic of process 700 may emulate (prototype) the design including pseudo synchronous multiplexing logic data across multiple chips according to the configured programmable devices. For certain embodiments, the processing logic of process 700 may also be based on application-specific integrated circuits (ASICs).

Figure 8:
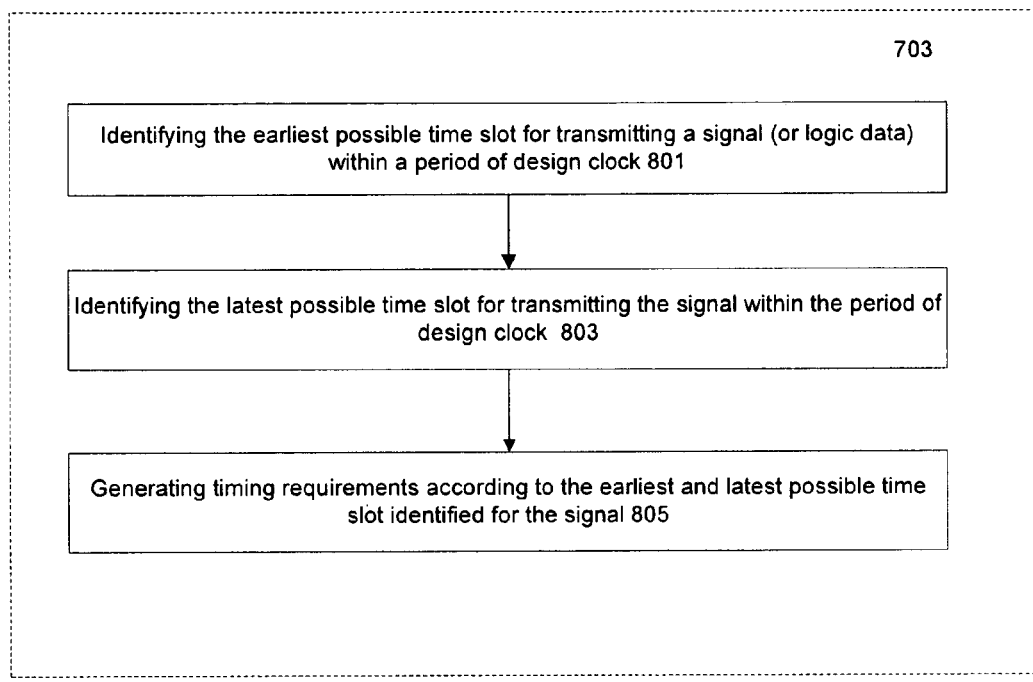
FIG. 8 is a flow diagram illustrating a process to perform timing analysis for a design according to one embodiment of he present invention.

FIG. 8 is a flow diagram illustrating a process to perform timing analysis for a design according to one embodiment of the present invention. Exemplary process 800 may be performed by a processing logic that may comprise hardware (circuitry, dedicated logic, etc.), software (such as is run on a dedicated machine), or a combination of both. For example exemplary process 800 may perform timing analysis operations included in block 703 of FIG. 7. In one embodiment, at block 801, the processing logic of process 800 identifies an earliest time slot (or transmission slot) for transmitting data value (or a logic signal) among time slots within a period (or cycle) of a design clock, such as design clock 310 of FIG. 3. The processing logic of process 800 may compute the earliest possible sampling time relative to the design clock edge for each transmission slot. For example, the processing logic of process 800 may take into account the earliest possible reset of a transmission counter associated with a synchronization logic for transmitting the data, such as slot counter 213 of FIG. 2.

At block 803, the processing logic of process 800 may identify the latest possible time slot for transmitting the data within the period of the design clock. In one embodiment, the processing logic of process 800 computes the latest possible delivery time relative to a receiving design clock edge. The processing logic of process 800 may take into account the latest possible time of reset of a transmission counter associated with the synchronization logic for transmitting the data. Subsequently at block 805, the processing logic of process 800 can generate timing requirements based on the identified earliest and latest transmission slots for the data. The timing requirement may include the earliest sample time and the latest delivery time for the data.

Figure 9:
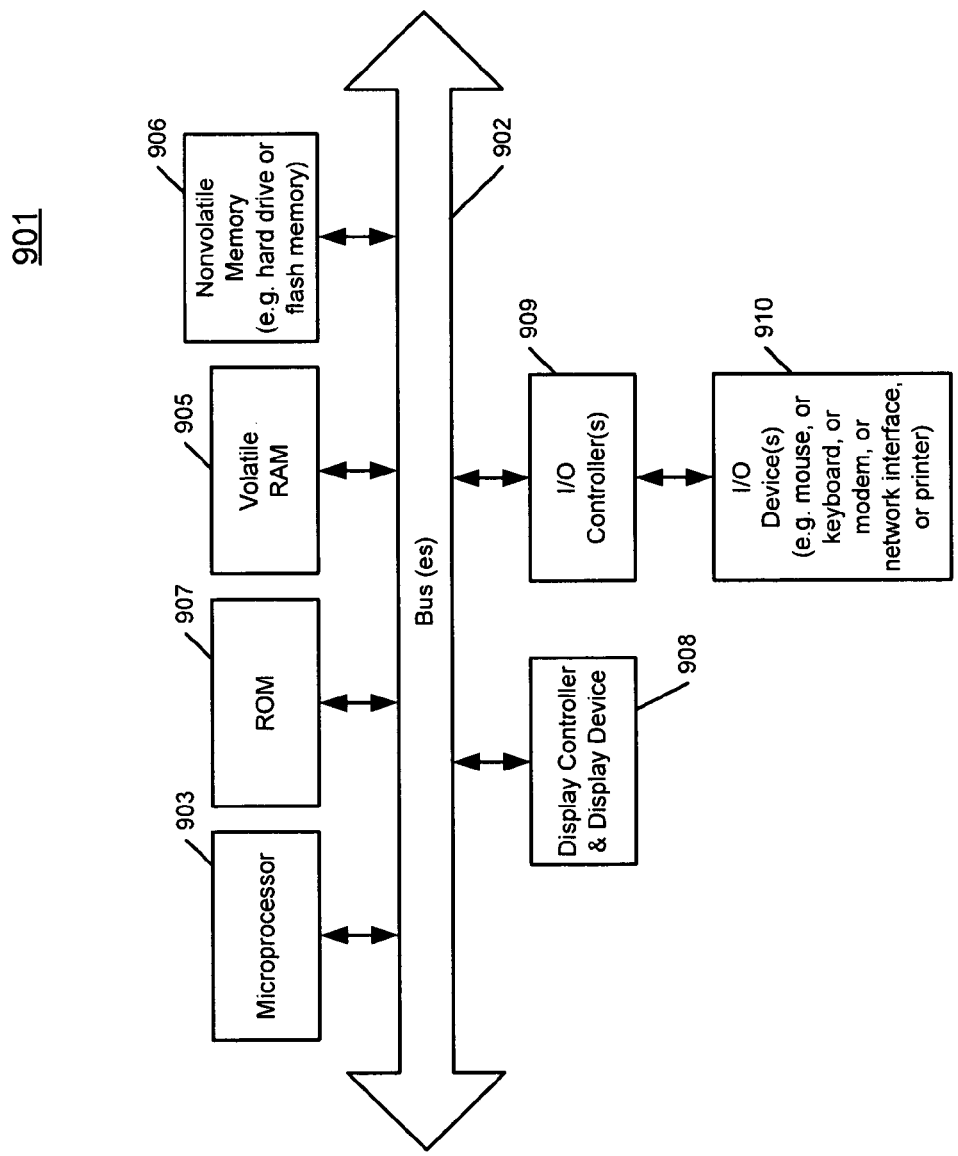
FIG. 9 shows an example of a data processing system which may be used with one embodiment of the present invention.

FIG. 9 shows an example of a data processing system which may be used with one embodiment of the present invention. Note that while FIG. 9 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 9 may, for example, be an Apple Macintosh computer.

As shown in FIG. 9, the computer system 901, which is a form of a data processing system, includes a bus 902 which is coupled to a microprocessor 903 and a ROM 907 and volatile RAM 905 and a non-volatile memory 906. The microprocessor 903, which may be a G3 or G4 microprocessor from Motorola, Inc. or IBM is coupled to cache memory 904 as shown in the example of FIG. 9. The bus 902 interconnects these various components together and also interconnects these components 903, 907, 905, and 906 to a display controller and display device 908 and to peripheral devices such as input/output (I/O) devices which may be mice, keyboards, modems, network interfaces, printers, scanners, video cameras and other devices which are well known in the art. Typically, the input/output devices 910 are coupled to the system through input/output controllers 909. The volatile RAM 905 is typically implemented as dynamic RAM (DRAM) which requires power continually in order to refresh or maintain the data in the memory. The non-volatile memory 906 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 1 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 902 may include one or more buses connected to each other through various bridges, controllers and/or adapters as is well known in the art. In one embodiment the 110 controller 909 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 907, volatile RAM 905, non-volatile memory 906, or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 903.

A machine readable storage medium can be used to store software and data which when executed by a data processing system causes the system to perform various methods of the present invention. This executable software and data may be stored in various places including for example ROM 907, volatile RAM 905, or non-volatile memory 906 as shown in FIG. 9. Portions of this software and/or data may be stored in any one of these storage devices.

Thus, a machine readable storage medium includes any mechanism stores information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.).

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A non-transitory computer readable storage medium containing executable computer program instructions, which when executed by a data processing system, cause the data processing system to perform a method to design an electronic system, the method comprising:
    generating a representation of a multiplexer logic to transmit data items asynchronously, relative to a design clock, in a number of transmission slots under control of a transmission clock from a first circuit to a second circuit, wherein the first circuit includes a plurality of data items to communicate externally from the first circuit;
    performing timing analysis for the plurality of data items, wherein the timing analysis comprises (i) identifying an earliest possible time slot within the design clock period to transmit each of the plurality of data items, (ii) identifying a latest possible time slot within the design clock period to transmit the data item, and (iii) generating timing requirements for the plurality of data items based on the identified earliest and latest possible time slots;
    grouping the plurality of data items into one or more data item groups, wherein each data item belongs to one of the data item groups;
    generating a representation of a counter logic which is coupled to the representation of the multiplexer logic to select for input to the multiplexer logic the data items to transmit asynchronously within a design cycle of the design clock; and
    generating a representation of a reset logic configured to repeatedly reset the counter logic.

2. The computer readable storage medium of claim 1, wherein the repeat reset of the counter logic is derived from edges of the design clock.

3. The computer readable storage medium of claim 1, wherein the method further comprises:
    determining the number of transmission slots for transmitting the data items within the design clock period, wherein each transmission slot corresponds to a time period derived from edges of the transmission clock.

4. The computer readable storage medium of claim 1, wherein the multiplexer logic is configured to transmit synchronization data to the second circuit to indicate the positions of the transmission slots.

5. The computer readable storage medium of claim 4, wherein the synchronization data is transmitted within one or more transmission slots subsequent to the number of transmission slots for transmitting the logic data.

6. The computer readable storage medium of claim 4, wherein the method further comprises:
    generating a representation of synchronization logic configured to generate the synchronization data.

7. The computer readable storage medium of claim 4, wherein the counter logic includes a plurality of states, and wherein the multiplexer logic selects one of the data items and synchronization data to transmit in a transmission slot based on one of the plurality of states.

8. The computer readable storage medium of claim 7, wherein the multiplexer logic transmits the synchronization data when the counter logic changes states driven by the design clock.

9. The computer readable storage medium of claim 4, wherein the multiplexer logic is associated with a channel to transmit the data items asynchronously relative to the design clock, the method further comprising:
    generating a representation of a plurality of channels to transmit multiple data items in parallel asynchronously relative to the design clock, wherein the plurality of channels include the channel and wherein the multiple data items include the data items.

10. The computer readable storage medium of claim 9, wherein the channel is associated with the counter logic and the reset logic and wherein the plurality of channels share the counter logic and the reset logic.

11. The computer readable storage medium of claim 10, wherein the channel transmits the synchronization data and wherein at least one of the channels transmits one of the multiple data items concurrently while the channel transmits the synchronization data.

12. The computer readable storage medium of claim 1, wherein the method further comprises:
assigning each signal of the plurality of data items to one of the number of transmission slots according to the timing requirements.

13. The computer readable storage medium of claim 1, wherein the method further comprises:
assigning a single initial value to data items for at least one design clock period to initialize the synchronization data.

14. A non-transitory computer readable storage medium containing executable computer program instructions, which when executed by a data processing system, cause the data processing system to perform a method to design an electronic system, the method comprising:
generating a representation of de-multiplexer logic to receive data items asynchronously, relative to a design clock, in a number of transmission slots under control of a transmission clock from a first circuit to a second circuit;
generating a representation of counter logic which is coupled to the representation of the de-multiplexer logic to receive the data items asynchronously within a design clock period of the design clock, wherein the counter logic includes a plurality of states, and wherein the counter logic transitions among the plurality of states driven by the transmission clock when the data items are received, wherein the plurality of states include a saturation state and a reset state, wherein the counter logic transitions into the saturation state by the transmission clock after receiving the data items, and wherein the reset logic resets the counter logic from the saturation state into the reset state; and
generating a representation of a synchronization detection logic configured to generate a reset signal to synchronize the counter with the transmission slots, wherein the synchronization detection logic detects synchronization data received from the first circuit, and wherein the synchronization detection logic aligns counter values with the transmission slots.

15. A digital circuit on a chip for communicating multiple data items over a communication port, the digital circuit comprising:
design logic to generate the multiple data items clocked by a design clock;
synchronization logic driven by the design clock and a transmission clock to generate synchronization signals, the design clock being asynchronous with the transmission clock, wherein the synchronization logic includes counter logic clocked by the transmission clock, wherein the synchronization logic includes reset logic clocked by the design clock to generate a reset signal to reset the counter logic; and
multiplexing logic coupled with the design logic and the synchronization logic to transmit the synchronization signals and the multiple data items over the communication port according to the transmission clock.

16. The digital circuit of claim 15, wherein the synchronization signals are generated when the counter logic saturates.

17. The digital circuit of claim 16, wherein the synchronization signals include a transition pattern aligned with the reset signal within a clock cycle of the transmission clock.

* * * * *